(12) United States Patent
Goto

(10) Patent No.: US 7,034,314 B2
(45) Date of Patent: Apr. 25, 2006

(54) PROJECTION APPARATUS FOR PROJECTING A PATTERN FORMED ON A MASK ONTO A SUBSTRATE AND A CONTROL METHOD FOR A PROJECTION APPARATUS

(75) Inventor: Susumu Goto, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/330,154

(22) Filed: Jun. 11, 1999

(65) Prior Publication Data

US 2003/0168617 A1 Sep. 11, 2003

(30) Foreign Application Priority Data

Jun. 15, 1998 (JP) .......................... 10-167193

(51) Int. Cl.
*H01J 37/26* (2006.01)

(52) U.S. Cl. ............... 250/396 ML; 250/492.1; 250/492.2

(58) Field of Classification Search ........... 250/492.1, 250/492.2, 492.22, 492.3, 493.1, 396 R, 250/396 ML, 491.1, 397, 398, 310, 369, 250/305; 430/311, 312; 355/67
See application file for complete search history.

(56) References Cited

U.S. PATENT DOCUMENTS

| 3,644,700 | A | * | 2/1972 | Kruppa et al. ......... 219/121.29 |
| 4,198,569 | A | * | 4/1980 | Takayama ............... 250/492.2 |
| 4,389,571 | A | * | 6/1983 | Crewe .................... 250/396 R |
| 4,469,949 | A | * | 9/1984 | Mori et al. .............. 250/491.1 |
| 4,544,847 | A | * | 10/1985 | Taylor ................... 250/396 ML |
| 4,560,879 | A | * | 12/1985 | Wu et al. ................ 250/492.2 |
| 4,812,662 | A |   | 3/1989 | Goto et al. .............. 250/491.1 |
| 4,939,371 | A |   | 7/1990 | Goto ......................... 250/397 |
| 4,954,717 | A | * | 9/1990 | Sakamoto et al. ....... 250/492.3 |
| 5,578,821 | A | * | 11/1996 | Meisberger et al. ........ 250/310 |
| 5,864,142 | A |   | 1/1999 | Muraki et al. .......... 250/491.1 |
| 5,929,454 | A |   | 7/1999 | Muraki et al. .......... 250/491.1 |
| 6,225,637 | B1 | * | 5/2001 | Terashima et al. ....... 250/492.2 |
| 6,555,824 | B1 | * | 4/2003 | Feuerbaum et al. .... 250/396 R |
| 6,633,366 | B1 | * | 10/2003 | de Jager et al. .............. 355/67 |

FOREIGN PATENT DOCUMENTS

EP 0 838 837 A2 4/1998

* cited by examiner

*Primary Examiner*—John R. Lee
*Assistant Examiner*—David A. Vanore
(74) *Attorney, Agent, or Firm*—Fitzpatrick, Cella, Harper & Scinto

(57) ABSTRACT

A projection apparatus includes a charged particle beam source, a reduction lens, a charged particle shaping aperture having an arcuate opening, a collimator lens, and first and second projection lenses. A charged particle beam emerging from the charged particle beam source irradiates a mask placed on a mask stage to transfer a pattern on the mask onto a sample on a sample stage. The first and second projection lenses can move their first and second principal plane positions with an excitation strength ratio control circuit.

28 Claims, 8 Drawing Sheets

PROJECTION APPARATUS FOR PROJECTING A PATTERN FORMED ON A MASK ONTO A SUBSTRATE AND A CONTROL METHOD FOR A PROJECTION APPARATUS

BACKGROUND OF THE INVENTION

1. Field of the Invention

The present invention relates to a projection apparatus for transferring a pattern formed on a mask by projecting it onto a substrate with a charged particle beam having an arcuate cross-section, and a method of controlling the same.

2. Description of the Related Art

Conventionally, in mass production of semiconductor memory devices, an optical stepper having high productivity has been used. In the production of new-generation memory devices from 1G- and 4G-DRAM memory devices having a line width of 0.2 μm or less, the high-productivity charged particle beam exposure method having high resolving power and using charged particles, e.g., electrons or ions, is a promising technique that replaces the optical exposure method.

The electron beam exposure method as an example of the charged particle beam exposure method is mainly performed in the forms of a Gaussian beam method and a variable shaped beam method, and accordingly has a low productivity. Therefore, the electron beam exposure method has been used in only applications such as mask making, research and development of VLSIs, and the manufacturing process of ASIC devices on small-lot production, where the characteristics of the excellent resolution performance of the electron beam are effectively used. To employ the electron beam exposure method in mass production, an increase in its productivity is a significant problem.

In recent years, a cell projection method has been proposed as one method that solves this problem. According to this method, the repeated portion of the memory circuit pattern is divided into cells each having several μm regions, and the pattern is exposed in units of cells. With this method, the maximum region that can be exposed at once has a size as small as about several μm. A plurality of deflectors are used to enlarge the exposure region. As the exposure region becomes large, deflection aberrations increase. These deflection aberrations are eliminated by dynamic correction using focus coils and stigmators. This method can enlarge the maximum region that can be exposed at once. However, it takes a comparatively long period of time till the deflected electron beam is settled at a desired position. This decreases the productivity.

An electron beam projection exposure method is under development which does not require a time for settling the electron beam. The projection system of an apparatus of this type uses a symmetric magnetic doublet lens. Also, an aperture for separating scattered electrons and unscattered electrons at the pattern portion and mask membrane portion, respectively, of the transfer mask from each other is arranged at a position that divides the distance between the mask and a photosensitive member in accordance with the magnification ratio. The positions of the principal planes of the two magnetic lenses of the magnetic lens are respectively set between the mask and the aperture, and at the intermediate position of the distance between the aperture and a sample coated with the photosensitive member. The two magnetic lenses can move only a small distance when they are mechanically adjusted. According to the electron beam projection exposure method, the pattern to be transferred onto the sample is divided into a plurality of partial patterns, and the divided partial patterns are formed on a mask. While an electron beam irradiates a selected partial pattern on the mask, the mask and sample are continuously moved in opposite directions. An electron beam transmitted through the mask irradiates the sample, thereby exposing the sample. Since this method does not perform electron beam scanning, it does not take much time to settle the electron beam. As a result, this method has a higher productivity than other methods described above.

In the case of the electron beam projection apparatus described above, the exposure width of one exposure operation is generally several mm to several ten mm. Image distortion and off-axis aberration mainly caused by field curvature of the projection lens become larger than in the conventional apparatus, thus degrading the exposure pattern's resolution. In order to prevent degradation in the resolution, the region of the pattern of the mask to be irradiated with the electron beam may be reduced. However, this cannot achieve a great improvement in productivity as compared to the conventional electron beam exposure method.

SUMMARY OF THE INVENTION

The present invention has been made in view of the above situation, and has as its object to increase the width of a pattern which can be transferred onto a sample with one scanning operation, thereby improving the productivity.

According to the first aspect of the present invention, there is provided a projection apparatus for projecting a pattern formed on a mask held by a mask stage onto a sample on a sample stage and transferring the projected pattern, comprising a charged particle beam source, a shaping system for shaping a charged particle beam emerging from the charged particle beam source to have an arcuate cross-section, a projection optical system including a projection lens including a pair of magnetic lenses, the projection optical system being located between the shaping system and the sample stage, a driver for supplying excitation currents to the pair of magnetic lenses to drive the projection lens, and a controller for controlling the ratio of the currents to be supplied from the driver to the pair of magnetic lenses to move the position of a principal plane of the projection lens.

In the projection apparatus according to the first aspect of the present invention, for example, the controller preferably controls the ratio of the currents to be supplied from the driver to the pair of magnetic lenses so as to correct image distortion of the projection optical system.

In the projection apparatus according to the first aspect of the present invention, for example, the projection optical system preferably includes a second projection lens including a pair of magnetic lenses to which excitation coil currents are supplied from the driver, and the controller preferably controls the ratio of the currents to be supplied from the driver to the pair of magnetic lenses of the second projection lens to move the position of the principal plane of the second projection lens so as not to change an image position and magnification of the projection optical system when correcting image distortion of the projection optical system by controlling the first projection lens.

In the projection apparatus according to the first aspect of the present invention, for example, the projection apparatus preferably further comprises acquisition means for acquiring image information indicating a feature of an image projected onto the sample stage by measurement, and the controller preferably controls the ratio of the currents to be supplied to the pair magnetic lenses so as to correct the image distortion of the projection optical system on the basis of the image information.

In the projection apparatus according to the first aspect of the present invention, for example, the image information preferably contains information indicating the radius of an image formed on the sample stage with the arcuate cross-sectional charged particle beam emerging from the shaping system.

In the projection apparatus according to the first aspect of the present invention, for example, the controller preferably controls the ratio of the currents to be supplied to the pair of magnetic lenses, so that the measured radius coincides with the theoretical radius obtained when the projection optical system has no aberration.

In the projection apparatus according to the first aspect of the present invention, for example, the image information is preferably information indicating the an image height of an image formed on the sample stage with the arcuate cross-sectional charged particle beam that has passed through the shaping system.

In the projection apparatus according to the first aspect of the present invention, for example, the controller preferably controls the ratio of the currents to be supplied to the pair of magnetic lenses, so that the actually measured image height coincides with the theoretical image height obtained when the projection optical system has no aberration.

In the projection apparatus according to the first aspect of the present invention, for example, the mask stage is preferably arranged between the shaping system and the projection optical system, the acquisition means preferably comprises an image distortion measurement mask having a transmitting system that passes therethrough a predetermined portion of the arcuate cross-sectional charged particle beam emerging from the shaping portion, the mask being held by the mask stage during measurement, and a measurement unit for measuring coordinates of a position where the charged particle beam that has passed through the transmitting system becomes incident on the sample stage, and image information indicating a feature of an image projected onto the sample stage is preferably calculated on the basis of the measured coordinates.

In the projection apparatus according to the first aspect of the present invention, for example, the image distortion measurement mask preferably has a plurality of transmitting systems arranged arcuatedly, and the measurement unit preferably measures coordinates of respective positions where charged particle beams that have passed through the transmitting systems become incident on the sample stage.

In the projection apparatus according to the first aspect of the present invention, for example, the acquisition means preferably calculates the radius of an image projected onto the sample stage on the basis of a plurality of measured coordinates, and the controller preferably controls the ratio of the currents to be supplied from the driver to the pair of magnetic lenses, so that the radius obtained by measurement coincides with the theoretical radius obtained when the projection optical system has no aberration.

In the projection apparatus according to the first aspect of the present invention, for example, the acquisition means preferably further comprises a substrate having a mark, the substrate being placed on the sample stage during measurement, and the measurement unit preferably detects backscattering from the substrate, thereby measuring coordinates of a position where the charged particle beam that has passed through the transmitting system becomes incident on the sample stage.

In the projection apparatus according to the first aspect of the present invention, for example, measurement of the coordinates of the incident position is preferably performed while moving the sample stage such that the mark moves across the position where the charged particle beam that has passed through the transmitting system becomes incident on the sample stage.

In the projection apparatus according to the first aspect of the present invention, for example, the mark is preferably a crisscross mark made of a heavy metal.

According to the second aspect of the present invention, there is provided a control method for a projection apparatus having a mask stage for holding a mask, a sample stage for placing thereon a sample on which a pattern formed on the mask is to be projected and transferred, a charged particle beam source, a shaping aperture for shaping a charged particle beam emerging from the charged particle beam source to have an arcuate cross-section, a projection optical system including a projection lens including a pair of magnetic lenses, the projection optical system being located between the shaping system and the sample stage, and a driver for supplying excitation currents to the pair of magnetic lenses to drive the projection lens, comprising the acquisition step of acquiring correction information necessary for correcting the aberration of the projection optical system, and the control step of controlling the ratio of the currents to be supplied from the driver to the pair of magnetic lenses (doublet lens) to move the position of a principal plane of the projection lens.

In the control method for the projection apparatus according to the second aspect of the present invention, for example, the control step preferably comprises correcting image distortion of the projection optical system on the basis of the correction information.

In the control method for the projection apparatus according to the second aspect of the present invention, for example, the projection optical system preferably includes a second projection lens including a pair of magnetic lenses (doublet lens) to which excitation currents are supplied from the driver, and the control step preferably comprises controlling the ratio of the currents to be supplied from the driver to the pair of magnetic lenses of the second projection lens to move the position of a principal plane of the second projection lens so as not to change an image position and magnification of the projection optical system when correcting image distortion of the projection optical system by controlling the first projection lens.

In the control method for the projection apparatus according to the second aspect of the present invention, for example, the acquisition step preferably includes the measurement step of acquiring by measurement image information indicating a feature of an image projected onto the sample stage as the correction information, and the control step preferably comprises correcting image distortion of the projection optical system on the basis of the image information.

In the control method for the projection apparatus according to the second aspect of the present invention, for example, the image information preferably contains information indicating the radius of an image formed on the sample stage with the arcuate cross-sectional charged particle beam emerging from the shaping system.

In the control method for the projection apparatus according to the second aspect of the present invention, for example, the control step preferably comprises controlling the ratio of the currents to be supplied to the pair of magnetic lenses, so that the measured radius coincides with a theoretical radius obtained when the projection optical system has no aberration.

In the control method for the projection apparatus according to the second aspect of the present invention, for example, the image information is preferably information indicating the image height of an image formed on the sample stage with the arcuate cross-sectional charged particle beam that has passed through the shaping system.

In the control method for the projection apparatus according to the second aspect of the present invention, for example, the control step preferably comprises controlling the ratio of the currents to be supplied to the pair of magnetic lenses, so that the actually measured image height coincides with a theoretical image height obtained when the projection optical system has no aberration.

In the control method for the projection apparatus according to the second aspect of the present invention, for example, the mask stage is preferably arranged between the shaping system and the projection optical system, the acquisition step preferably comprises the preparation step of causing the mask stage to hold an image distortion measurement mask having a transmitting system that passes therethrough a predetermined portion of the arcuate cross-sectional charged particle beam emerging from the shaping system, the measurement step of measuring coordinates of a position where the charged particle beam that has passed through the transmitting system becomes incident on the sample stage, and the calculation step of calculating, as correction information necessary for correcting image distortion of the projection optical system, image information indicating a feature of an image projected onto the sample stage on the basis of the measured coordinates, and the control step preferably comprises controlling the ratio of the currents to be supplied from the driver to the pair of magnetic lenses to move the position of a principal plane of the projection lens so as to correct image distortion of the projection optical system on the basis of the correction information.

In the control method for the projection apparatus according to the second aspect of the present invention, for example, the image distortion measurement mask preferably has a plurality of transmitting systems arranged arcuatedly, and the measurement step preferably comprises measuring coordinates of respective positions where charged particle beams that have passed through the transmitting systems become incident on the sample stage.

In the control method for the projection apparatus according to the second aspect of the present invention, for example, the calculation step in the acquisition step preferably comprises calculating a radius of an image projected onto the sample stage on the basis of a plurality of measured coordinates, and the control step preferably comprises controlling the ratio of the currents to be supplied from the driver to the pair of magnetic lenses, so that a radius obtained by measurement coincides with a theoretical radius obtained when the projection optical system has no aberration.

In the control method for the projection apparatus according to the second aspect of the present invention, for example, the acquisition step preferably further comprises the step of placing a substrate having a mark on the sample stage before measurement, and the measurement step in the acquisition step preferably comprises detecting backscatter electrons from the substrate, thereby measuring coordinates of a position where the charged particle beam that has passed through the transmitting system becomes incident on the sample stage.

In the control method for the projection apparatus according to the second aspect of the present invention, for example, the measurement step preferably comprises measuring the coordinates of the incident position while moving the sample stage such that the mark moves across the position where the charged particle beam that has passed through the transmitting system becomes incident on the sample stage.

In the control method for the projection apparatus according to the second aspect of the present invention, for example, the mark is preferably a crisscross mark made of a heavy metal.

According to the third aspect of the present invention, there is provided a method of manufacturing a device, comprising the steps of fixing a mask on the mask stage of the above projection system, placing a sample on the sample stage of the projection system, and transferring a pattern formed on the mask onto the sample.

A pattern for forming any one of devices, e.g., a semiconductor chip such as an IC or LSI, a liquid crystal panel, a CCD, a thin film magnetic head, and a micromachine, can be formed on the mask. A suitable example of the sample is, e.g., a silicon wafer or glass substrate coated with a photoresist. The mask can be fixed to the mask stage by, e.g., the operator. The sample can be placed on the sample stage by, e.g., a transfer robot.

Further objects, features and advantages of the present invention will become apparent from the following detailed description of embodiments of the present invention with reference to the accompanying drawings.

DETAILED DESCRIPTION OF THE PREFERRED EMBODIMENTS

The preferred embodiments of the present invention will be described with reference to the accompanying drawings.

Figure 1:
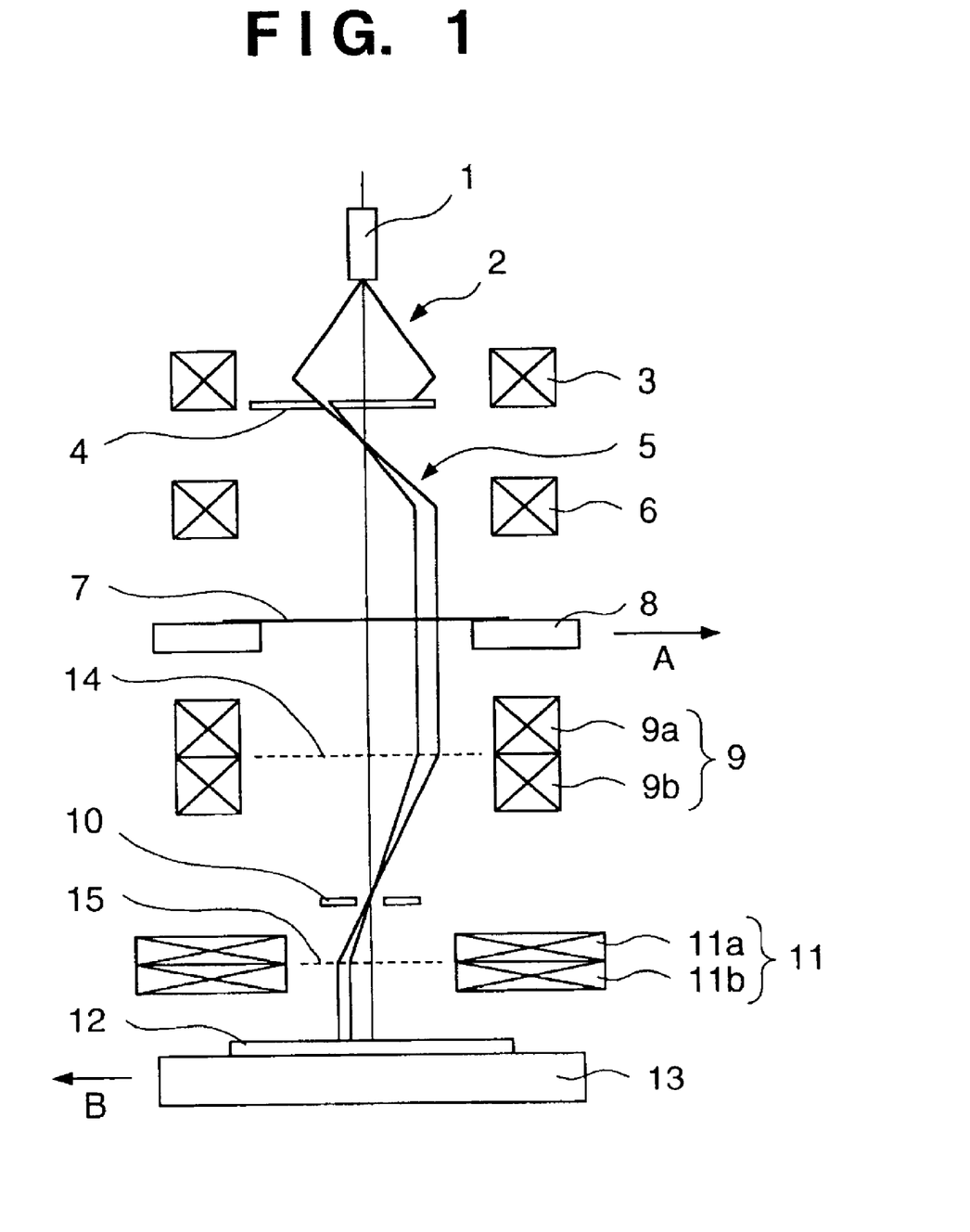
FIG. 1 is a view showing the arrangement of a charged particle beam projection system according to an embodiment of the present invention.

FIG. 1 is a view showing the arrangement of a charged particle projection system apparatus according to an embodiment of the present invention.

The charged particle projection system of this embodiment has a charged particle beam source 1, a reduction lens 3, a charged particle shaping aperture 4, a collimator lens 6, and first and second projection lenses 9 and 11. A charged particle beam 2 emerging from the charged particle beam source 1 irradiates a mask 7 placed on a mask stage 8 to transfer a pattern on the mask 7 onto a sample 12 on sample stage 13.

The charged particle beam source 1 emits the charged particle beam 2. The cross-over image of the charged particle beam 2 is focused by the reduction lens 3 onto the charged particle shaping aperture 4. An arcuate slit is formed in the charged particle shaping aperture 4 on its circumference about the optical axis of the charged particle beam source 1 and reduction lens 3 as the center to be separate from this optical axis. When the charged particle beam 2 passes through the charged particle shaping aperture 4, it is shaped to have an arcuate cross-section. When a large exposure region is to be ensured by using a charged particle beam 2 near the optical axis, the farther from the optical axis in the radial direction, the larger the field curvature. Since the arcuate slit of the charged particle shaping aperture 4 is formed at an almost equidistant position from the center of the optical axis, the field curvature can be decreased to a negligible degree, while a large exposure region can be ensured. An arcuate cross-sectional charged particle beam 5, having passed through the charged particle shaping aperture 4 to have an arcuate cross-section, then forms an arcuate cross-sectional parallel beam through the collimator lens 6 to uniformly irradiate the mask 7 placed on the mask stage 8.

The arcuate cross-sectional charged particle beam 5 composed of two types of charged particles, i.e., charged particles scattered by the pattern portion of the mask 7 and charged particles substantially not scattered by the plate of the mask 7, is reduced with a reduction ratio set by the first projection lens 9 constituted by a pair of magnetic or electrostatic lenses. An aperture stop 10 is arranged between the mask 7 and sample 12, at a position that divides the distance between them with the reduction ratio of the first projection lens 9. The aperture stop 10 blocks the arcuate cross-sectional charged particle beam 5 scattered through the mask 7, and only the unscattered arcuate cross-sectional charged particle beam 5 passes through the aperture stop 10. The arcuate cross-sectional charged particle beam 5 passing through the aperture stop 10 is converted into a parallel beam by the second projection lens 11 composed by a pair of magnetic or electrostatic lenses, to project and expose the pattern of the mask 7 onto the sample 12 on the sample stage 13.

During exposure, the mask stage 8 where the mask 7 is placed continuously moves in the direction of arrow A, and the sample stage 13 continuously moves in synchronism with this in a direction of arrow B opposite to that of the mask stage 8, thereby performing exposure.

When the arcuated slit formed at an almost equidistant position from the center of the optical axis is used as described above, the field curvature as one main factor of off-axis aberrations can be decreased to the negligible degree. Concerning the image distortion as another main factor, in the case of the arcuate cross-sectional charged particle beam 5, the image distortion need be removed only in the radial direction within an image height corresponding to the radius of the arc. The image height with image distortion may be detected, an error from the ideal image height may be calculated, and this error may be corrected.

Measurement and correction of the image distortion will be described.

Figure 2:
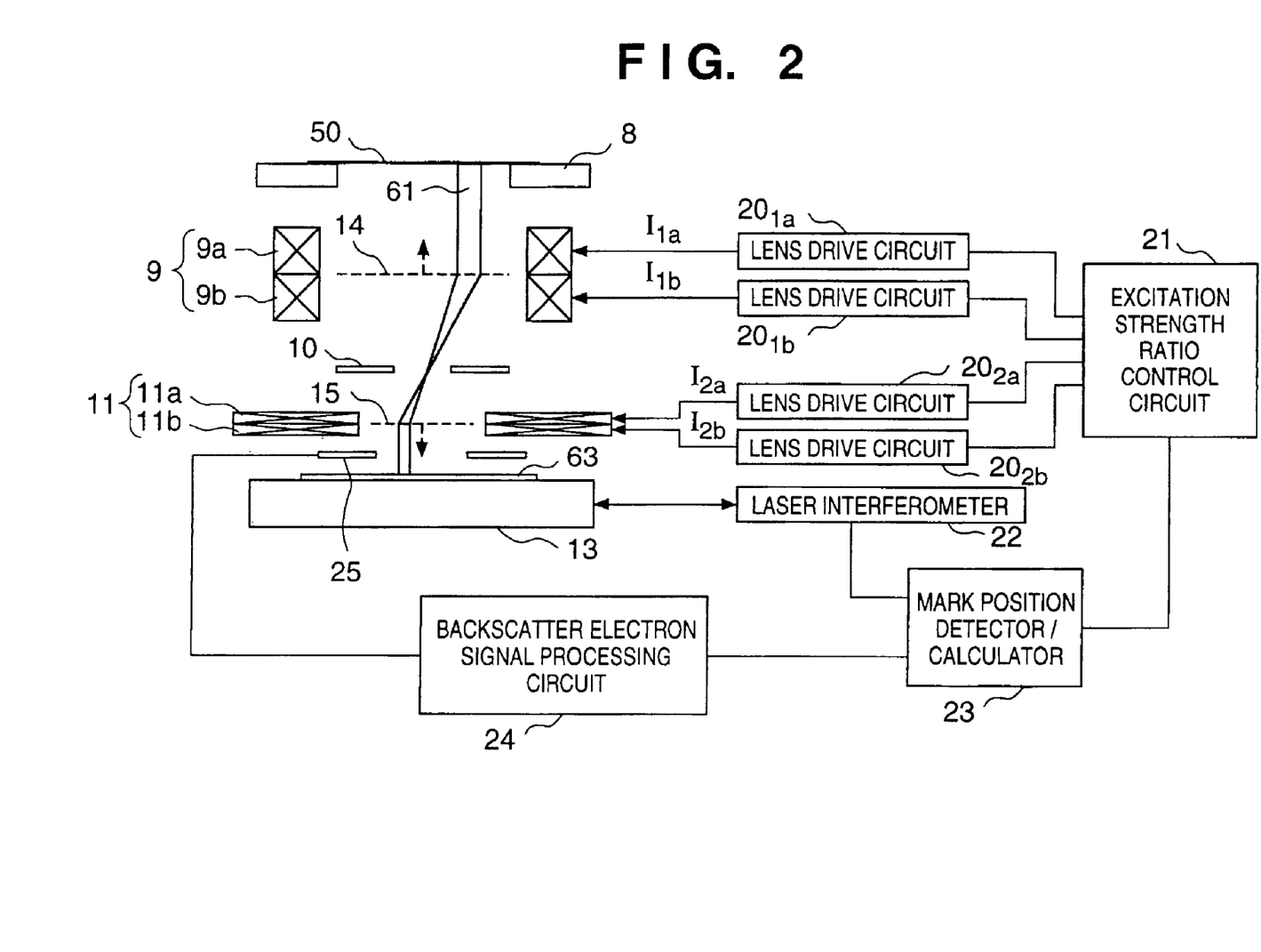
FIG. 2 is a block diagram of a control system concerning correction of the image distortion of the charged particle beam projection system shown in FIG. 1.

FIG. 2 is a block diagram of a control system, concerning correction of the image distortion, of the charged particle beam projection system shown in FIG. 1.

An image distortion amount measurement mask 50 formed with rectangular holes 51, 52, and 53 (see FIG. 4) for the purpose of image distortion amount measurement is placed on the mask stage 8. A charged particle beam 2 that has passed through any rectangular hole is shaped into a rectangular cross-sectional charged particle beam 61. A silicon substrate 63 formed with a crisscross mark 62 (see FIG. 5) for the purpose of image distortion amount measurement is placed on the sample stage 13, and a backscatter electron detector 25 is set above the silicon substrate 63.

The control system concerning correction of the image distortion is constituted by an excitation strength ratio control circuit 21, a laser interferometer 22, a mark position detector/calculator 23, and a reflected electron signal processing circuit 24.

Movement of the position of the principal plane caused by the magnetic lenses will be described.

Figure 3:
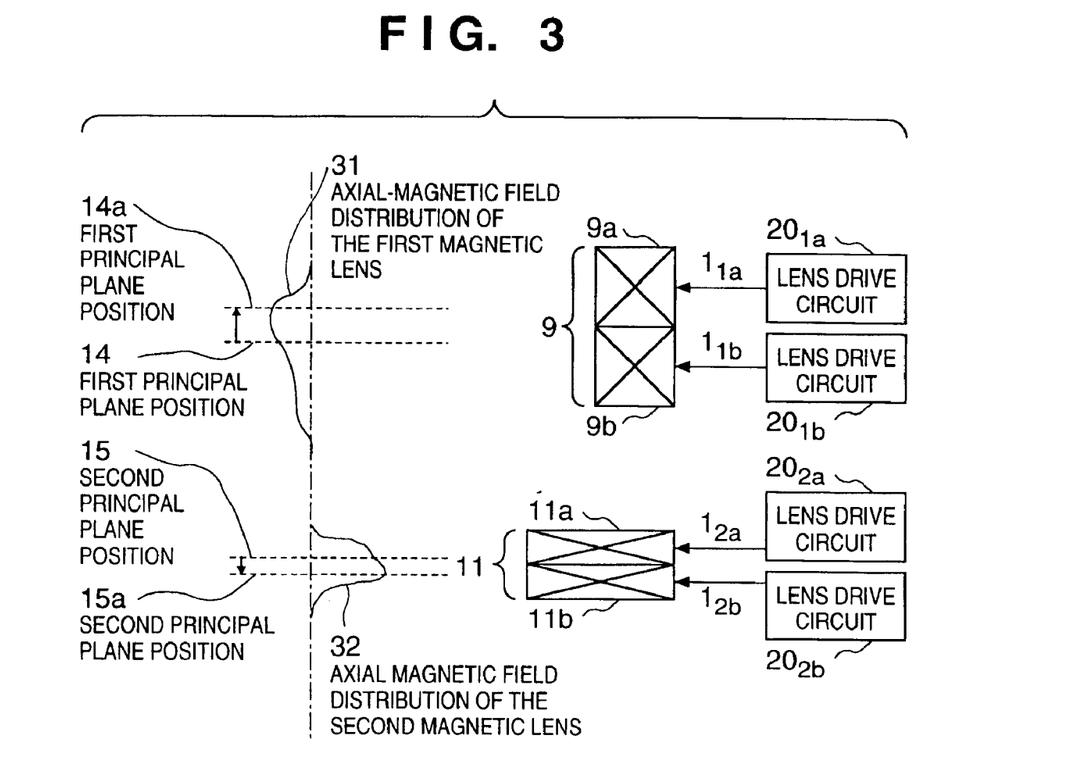
FIG. 3 is a view showing an axial magnetic field distribution of the charged particle projection system shown in FIG. 1.

FIG. 3 shows the distributions of axial magnetic fields formed of the first and second projection lenses 9 and 11 of FIG. 2.

The first projection lens 9 is composed of two magnetic lenses 9a and 9b, and the second projection lens 11 is composed of two magnetic lenses 11a and 11b. When currents $I_{1a}$ and $I_{1b}$ to be supplied from lens drive circuits $20_{1a}$ and $20_{1b}$ to the magnetic lenses 9a and 9b, respectively, are controlled independently of each other, an excitation strength ratio K1 of the two magnetic lenses 9a and 9b of the first projection lens 9 can be changed. Similarly, when currents $I_{2a}$ and $I_{2b}$ to be supplied from lens drive circuits $20_{2a}$ and $20_{2b}$ to the magnetic lenses 11a and 11b, respectively, are controlled independently of each other, an excitation strength ratio K2 of the two magnetic lenses 11a and 11b of the second projection lens 11 can be changed.

When the value of the excitation strength ratio K1 is changed, a first axial magnetic field distribution 31 can be formed asymmetric about the mechanical center position between the magnetic lenses 9a and 9b. As a result, for example, a first principal plane position 14 can be changed to a first principal plane position 14a. Similarly, when the value of the excitation strength ratio K2 is changed, a second axial magnetic field distribution 32 can be formed asymmetric about the mechanical center position between the magnetic lenses 11a and 11b. As a result, for example, a second principal plane position 15 can be changed to a second principal plane position 15a.

As described above, in this embodiment, the position of the principal plane can be adjusted electrically. This adjustment of the position of the principal plane can be performed easier than mechanical adjustment of the position of the projection lens, while providing high precision.

Measurement of image distortion will be described.

Figure 4:
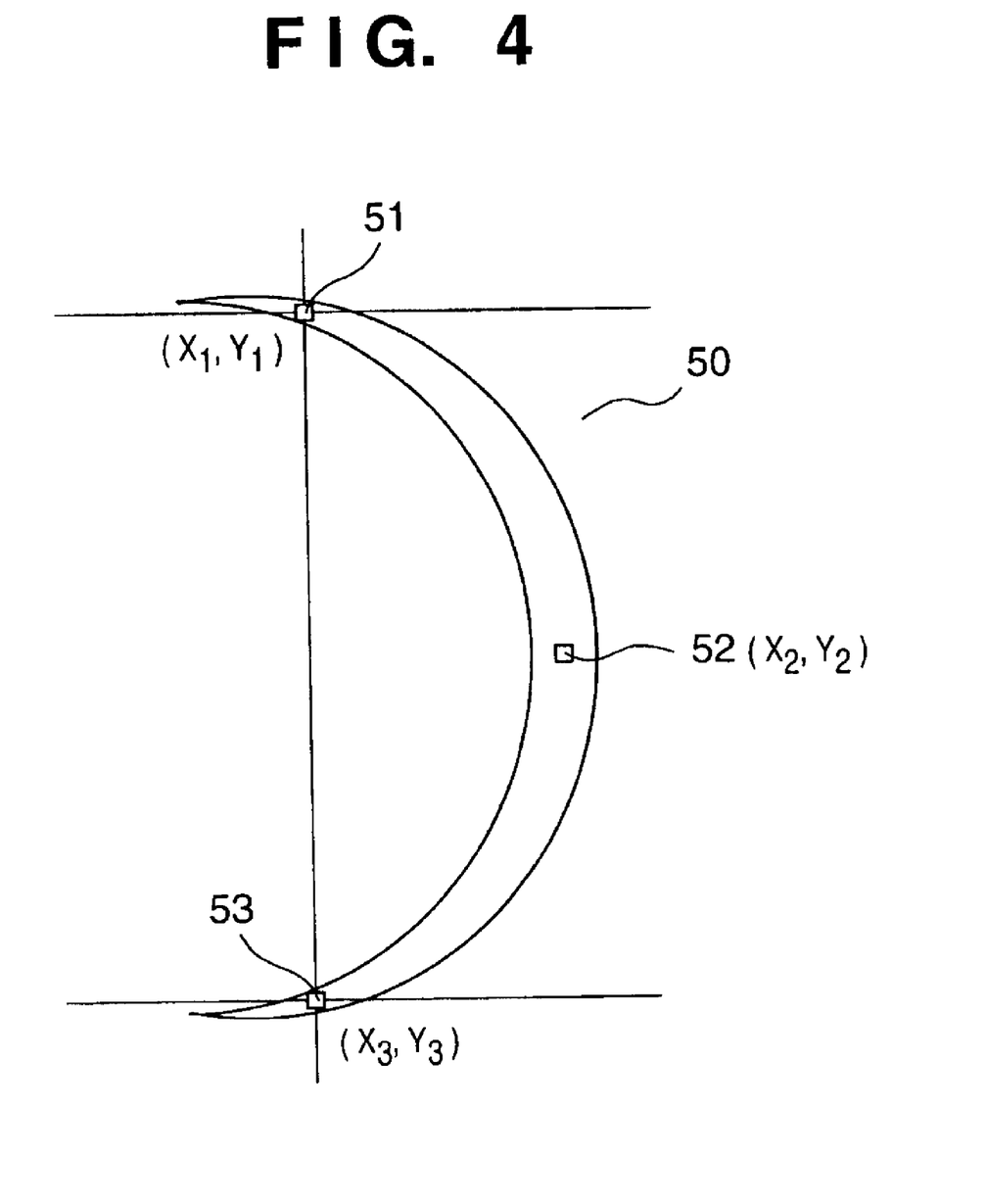
FIG. 4 is a view showing an image distortion amount measurement mask of this embodiment.
Figure 5:
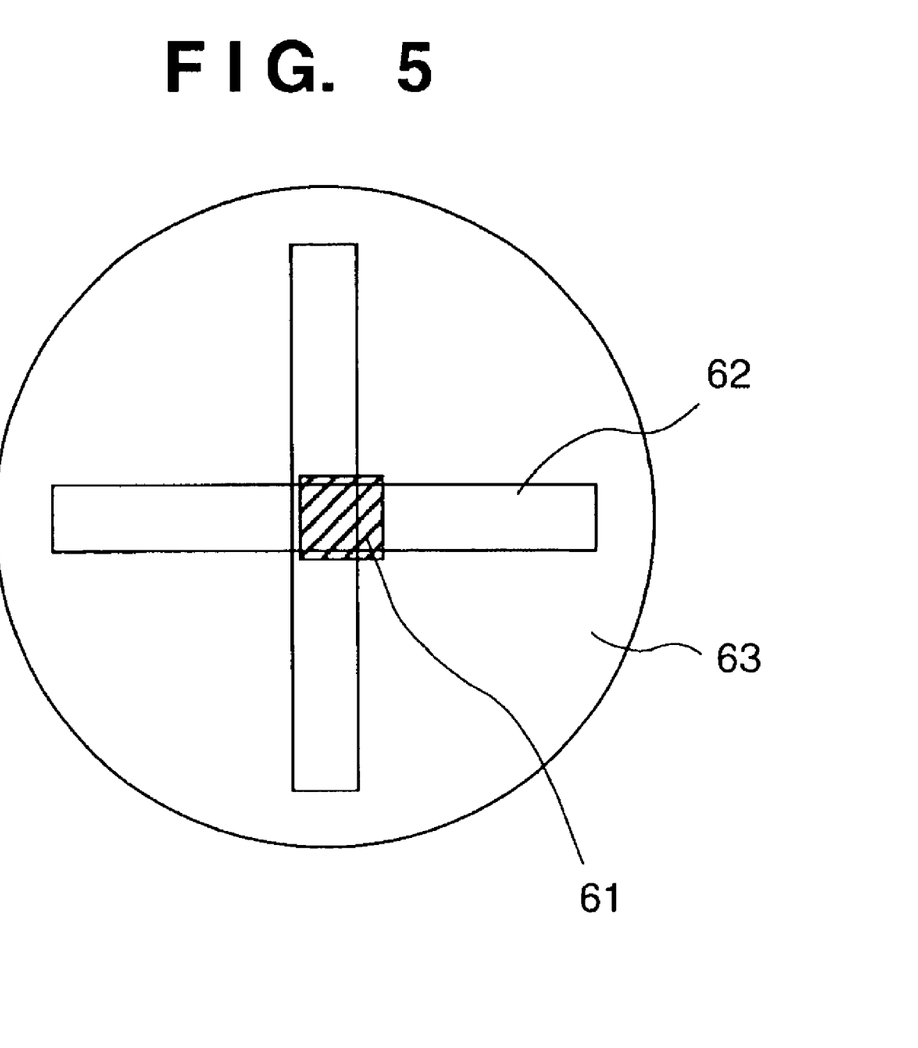
FIG. 5 is an enlarged view of a crisscross mark for image distortion amount measurement of this embodiment.

FIG. 4 is a view showing the image distortion amount measurement mask 50, and FIG. 5 is an enlarged view of the crisscross mark 62 for image distortion amount measurement.

In the charged particle beam projection system, the image distortion amount measurement mask 50 is mounted on the mask stage 8 before exposure of the sample 12, and the image distortion amount is measured by using the mask 50. The image distortion amount measurement mask 50 is formed with a plurality of rectangular small punched patterns for passing the arcuate cross-sectional charged particle beams therethrough. The positions of the punched patterns are measured with high precision in advance and are thus known. In FIG. 4, the rectangular holes 51, 52, and 53 are formed as three punched patterns, and their coordinate positions are known, i.e., (x1, y1), (x2, y2), and (x3, y3).

The silicon substrate 63 is mounted on the sample stage 13. The crisscross mark 62 made of a heavy metal is formed on the upper surface of the silicon substrate 63 to detect the positions of the rectangular holes 51, 52, and 53. The fine rectangular cross-sectional charged particle beam 61 that has passed through the rectangular hole 51 of the image distortion amount measurement mask 50 irradiates the sample stage 13 on which the silicon substrate 63 having the crisscross mark 62 is placed. Data indicating the approximate positions of the crisscross mark 62 on the sample stage 13 and the approximate irradiated position of the rectangular cross-sectional charged particle beam 61 are stored in a stage control system (not shown) in advance. The crisscross mark 62 on the sample stage 13 moves near the irradiated position of the rectangular cross-sectional charged particle beam 61 on the basis of these data. When the rectangular cross-sectional charged particle beam 61 moves across the crisscross mark 62, a larger number of backscatter electrons from the crisscross mark made of a heavy metal than the electrons reflected by the silicon substrate 63 are detected by the backscatter electron detector 25. The reflected electron detector 25 outputs a detection signal to the backscatter electron signal processing circuit 24. The backscatter electron signal processing circuit 24 performs signal processing and outputs a resultant signal to the mark position detector/calculator 23. This process is performed for both the x- and y-axis directions. After that, this operation is performed sequentially for the rectangular cross-sectional charged particle beams 61 that have passed through the remaining rectangular holes 52 and 53. As a result, the x- and y-coordinates of all the rectangular cross-sectional charged particle beams 61 are detected. Subsequently, these coordinates are output to the excitation strength ratio control circuit 21. The obtained coordinates of the plurality of rectangular cross-sectional charged particle beams 61 are subjected to fitting by a statistical means such as the method of least squares in the excitation strength ratio control circuit 21, so that they are converted into an arcuate cross-sectional charged particle beam. On the basis of the result of fitting, the central position and radius (image information) of the image on the silicon substrate 63 obtained when the arcuate cross-sectional charged particle beam 5 irradiates the silicon substrate 63 are calculated. The central position and radius of the arcuate image on the silicon substrate 63 obtained in this manner are compared with a desired central position and radius, thereby detecting the image distortion amount in the radial direction. To correct the detected image distortion amount, the excitation strength ratios K1 and K2 that define the first and second principal plane positions 14 and 15 are changed while the optimal operating conditions of the first and second projection lenses 9 and 11 are maintained. More specifically, the excitation strength ratio control circuit 21 instructs the lens drive circuits $20_{1a}$ to $20_{2b}$ to output the currents $I_{1a}$ and $I_{1b}$, and $I_{2a}$ and $I_{2b}$ that determine the excitation strength ratios K1 and K2 to the first and second projection lenses 9 and 11, and changes the excitation strength ratios K1 and K2 until the detected image distortion amount is removed.

Detection of the irradiated position of the rectangular cross-sectional charged particle beam described above has high precision since it is performed not while deflecting the charged particle beam but by measuring the position of the sample stage 13 with the laser interferometer 22 while moving the sample stage 13. Since correction of the image distortion amount need be performed only during calibration of the electron beam projection apparatus, the correcting process of the image distortion amount does not decrease the productivity of this apparatus.

Figure 6:
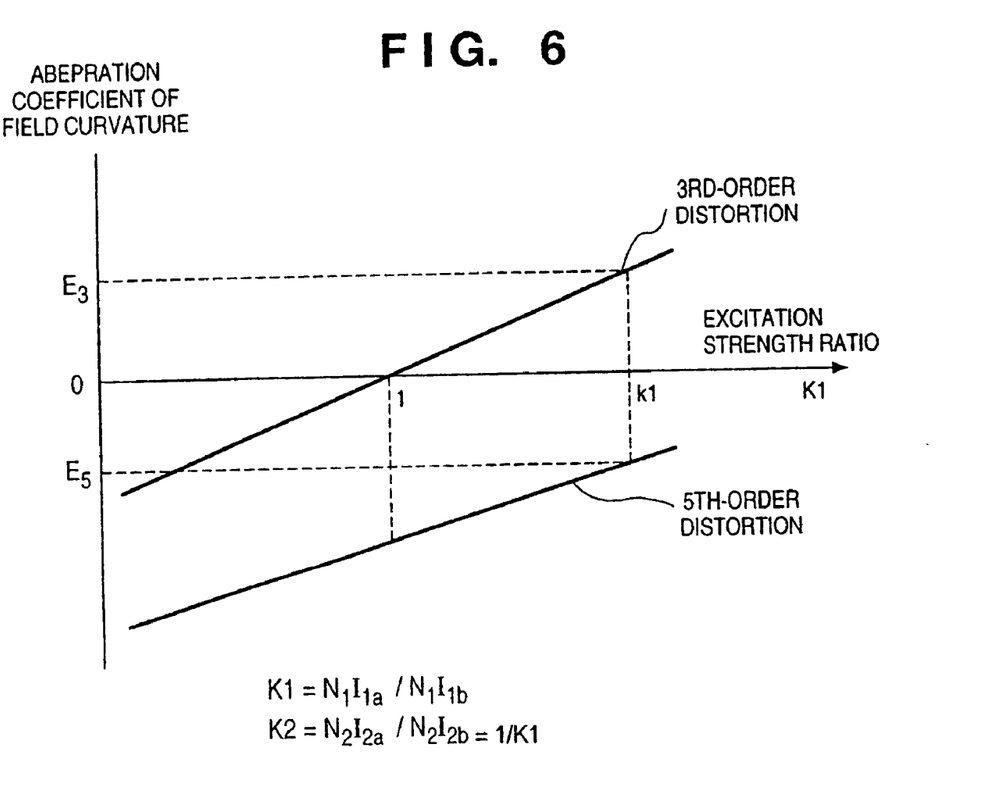
FIG. 6 is a conceptual view showing the relationship between the excitation strength ratio and the image distortion coefficient of the first projection lens.

The relationship between the strength ratio of excitation that defines the principal plane position on the first projection lens 9 and the image distortion coefficient exhibits a tendency as shown in FIG. 6.

In the conventional electron beam projection apparatus, the excitation strengths K1 and K2 are set to satisfy K1=K2=1. If the excitation strength ratio K1 is set at k1 (k1>1) and k1 is set on the right side of K1=1, as shown in FIG. 6, 3rd- and 5th-order image distortion coefficients $E_3$ and $E_5$ can cancel each other. Even when the exposure region is increased, the image distortion can be substantially corrected. In this case, assume that the absolute value of the moving amount of the second principal plane position 15 is set to a value obtained by multiplying the absolute value of the moving amount of the first principal plane position 14 by a magnification Mag, and that the moving direction of the second principal plane position 15 is set in the opposite direction to that of the first principal plane position 14. Then, even if the excitation conditions of the projection lenses are changed, the image position and the magnification Mag will not change. Another method is also available as the method of setting the excitation strength ratios K1 and K2. According to this method, while the image distortion amount of the arcuate cross-sectional charged particle beam is measured in accordance with the image distortion amount measurement amount described above, the excitation strength ratios K1 and K2 are gradually increased from 1 until conditions with which the measured image distortion amount can be corrected are obtained. In this case, if the number of turns of the coils of the first and second projection lenses 9 and 11 are respectively N1 and N2, the excitation strength ratios K1 and K2 are set by the excitation strength ratio control circuit 21 to satisfy the following equations:

$K2=1/K1$ $N1 \cdot I_{1a} + N1 \cdot I_{1b} = -(N2 \cdot I_{2a} + N2 \cdot I_{2b}) = \text{(constant)}$ $K1 = (N1 \cdot I_{1a})/(N1 \cdot I_{1b})$ $K2 = (N2 \cdot I_{2a})/(N2 \cdot I_{2b})$ so that conditions for the reduction ratio of the projection system, the position of the field, and image rotation maintain the designed values.

From the foregoing, if the charged particle beam 2 is an arcuate cross-sectional beam, the field curvature aberration as one main factor causing the off-axis aberrations can be eliminated, and the region of the pattern to irradiate can be enlarged. The image distortion can also be corrected by setting the excitation strengths K1 and K2 such that the ideal image height and the image height detected during correction coincide with each other. Furthermore, the excitation strength ratios K1 and K2 are set such that the 3rd- and 5th-order image distortion coefficients $E_3$ and $E_5$ can cancel each other even when the magnification Mag is changed to increase the exposure region. Thus, even if the exposure region is increased, the image distortion can be substantially corrected. As a result, the width of a pattern which can be exposed onto a sample with one scanning operation can be increased without decreasing the image resolution, leading to an improvement in productivity.

Figure 7:
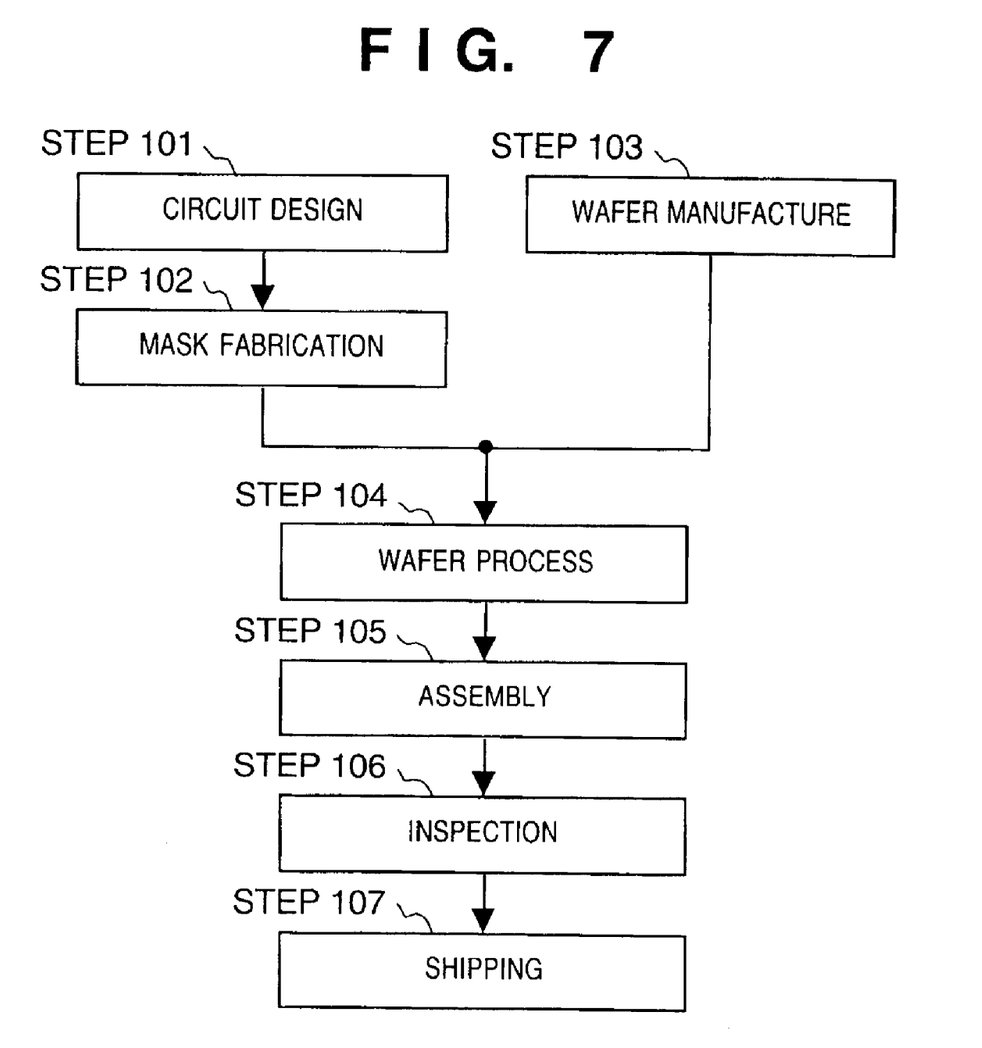
FIG. 7 is a flow chart showing the device manufacturing process.
Figure 8:
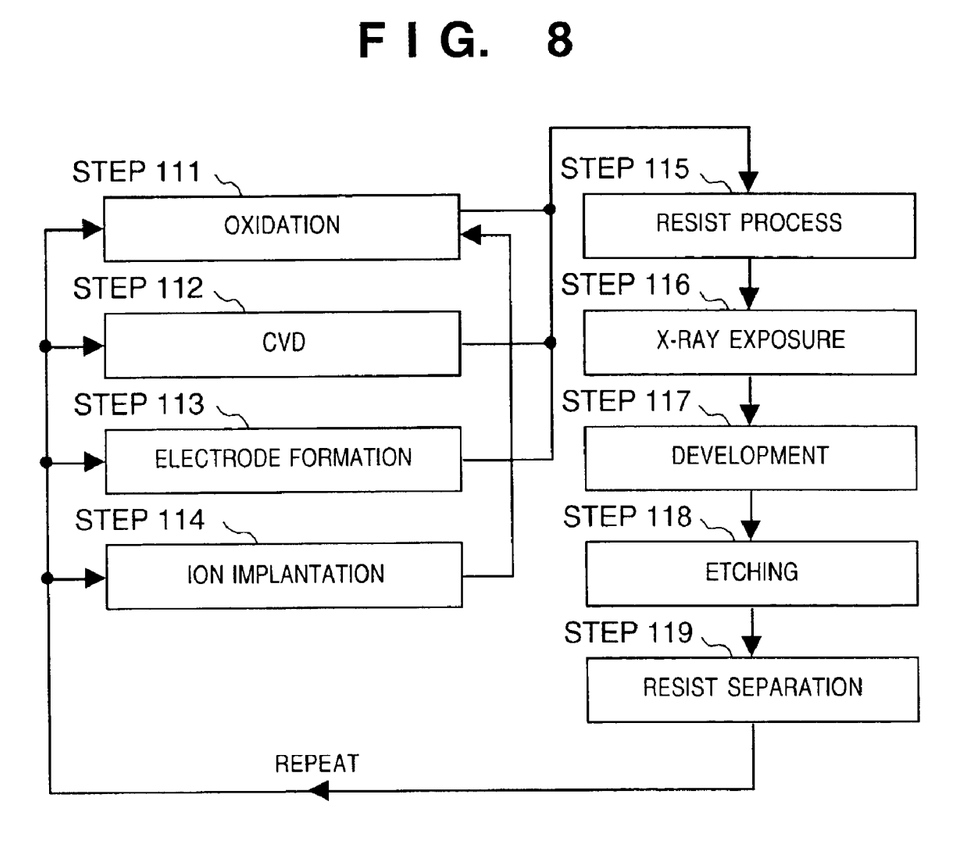
FIG. 8 is a flow chart showing detailed steps of the wafer process shown in FIG. 7.

An embodiment of a device manufacturing method utilizing the charged particle beam projection apparatus described above will be described. FIG. 7 shows the flow chart of the manufacture of a microdevice (a semiconductor chip such as an IC or LSI, a liquid crystal panel, a CCD, a thin film magnetic head, a micromachine, or the like). In step 101 (circuit design), the device pattern is designed. In step 102 (mask fabrication), a mask formed with the designed pattern is fabricated. In step 103 (wafer manufacture), a wafer is manufactured by using a material such as silicon or glass. Step 104 (wafer process) is called a pre-process. An actual circuit is formed on the wafer in accordance with lithography by using the prepared mask and wafer. Next step 105 (assembly) is called a post-process. The wafer fabricated by step 104 is formed into semiconductor chips. Step 105 includes steps such as an assembly step (dicing and bonding) and a packaging step (chip encapsulation). In step 106 (inspection), the semiconductor device fabricated in step 105 is inspected by an operation confirmation test, a durability test, and the like. The semiconductor device is completed through these steps, and is shipped (step 107). FIG. 8 shows the flow chart of this wafer process in detail. In step 111 (oxidation), the surface of the wafer is oxidized. In step 112 (CVD), an insulating film is formed on the surface of the wafer. In step 113 (electrode formation), electrodes are formed on the wafer by vapor deposition. In step 114 (ion implantation), ions are implanted in the wafer. In step 115 (resist process), a resist is applied to the wafer. In step 116 (exposure), the circuit pattern of the mask is baked on the plurality of shot regions of the wafer, and exposed in accordance with the exposure apparatus or method described above. In step 117 (development), the exposed wafer is developed. In step 118 (etching), a portion other than the developed resist image is removed. In step 119 (resist separation), the resist no longer necessary after etching is removed. These steps are repeatedly performed to form multiple circuit patterns on the wafer. When the production method of this embodiment is used, a large-size device, which is conventionally difficult to manufacture, can be manufactured at a low cost.

The present invention is not limited to the above embodiments and various changes and modifications can be made within the spirit and scope of the present invention. Therefore, to apprise the public of the scope of the present invention the following claims are made.

What is claimed is:

1. A projection apparatus for projecting a pattern formed on a mask held by a mask stage onto a substrate, said projection apparatus comprising:
   a charged particle beam source which emits a charged particle beam;
   an irradiation system which has a shaping system for shaping the charged particle beam to have an arcuate cross-section and which irradiates the mask with the arcuate cross-sectional charged particle beam;
   a projection optical system which projects the pattern onto the substrate, said projection optical system including a first unit having first and second magnetic lenses; and
   a controller arranged to move a principal plane of said first unit in a direction of an optical axis of said projection optical system so that an image distortion of said projection optical system is corrected,
   wherein said controller changes a distribution of an axial magnetic field generated by said first unit in the direction of the optical axis of said projection optical system to move the principal plane of said first unit by changing a ratio of currents to be respectively supplied to said first and second magnetic lenses, so that third-order image distortion and fifth-order image distortion substantially cancel each other.

2. The apparatus according to claim 1, wherein said projection optical system further includes a second unit having third and fourth magnetic lenses, and
   wherein said controller is further arranged to change a ratio of currents respectively supplied to said third and fourth magnetic lenses to move a principal plane of said second unit so as not to change an image position and magnification of said projection optical system when moving the principal plane of said first unit.

3. The apparatus according to claim 2, wherein said controller is further arranged to change the ratio of the currents respectively supplied to said third and fourth magnetic lenses under a condition that a sum of the currents respectively supplied to said third and fourth magnetic lenses is substantially constant.

4. The apparatus according to claim 1, wherein said projection apparatus further comprises an acquisition system which acquires image information indicating a feature of an image projected onto a substrate stage for supporting the substrate by measurement, and
   wherein said controller is further arranged to change the ratio of the currents to be respectively supplied to said first and second magnetic lenses so as to correct an image distortion of said projection optical system on the basis of the image information.

5. The apparatus according to claim 4, wherein said acquisition system acquires image information containing information indicating a radius of an image formed on the substrate stage with the arcuate cross-sectional charged particle beam emerging from said shaping system.

6. The apparatus according to claim 5, wherein said controller is further arranged to change the ratio of the currents to be respectively supplied to said first and second magnetic lenses, so that the measured radius coincides with a theoretical radius obtained when said projection optical system has no aberration.

7. The apparatus according to claim 4, wherein said acquisition system acquires image information containing information indicating an image height of an image formed on the substrate stage with the arcuate cross-sectional charged particle beam that has passed through said shaping system.

8. The apparatus according to claim 7, wherein said controller is further arranged to change the ratio of the currents to be respectively supplied to said first and second magnetic lenses, so that the actually measured image height coincides with a theoretical image height obtained when said projection optical system has no aberration.

9. The apparatus according to claim 4, wherein said acquisition system comprises (a) an image distortion measurement mask having a transmitting system that passes therethrough a predetermined portion of the arcuate cross-sectional charged particle beam, said mask being held by said mask stage during measurement, and (b) a measurement unit for measuring coordinates of a position where the charged particle beam that has passed through said transmitting system becomes incident on the substrate stage, and
   wherein said acquisition system calculates image information indicating a feature of an image projected onto the substrate stage on the basis of the measured coordinates.

10. The apparatus according to claim 9, wherein said image distortion measurement mask has a plurality of transmitting systems arranged arcuately, and wherein said measurement unit measures coordinates of respective positions where charged particle beams that have passed through said transmitting systems become incident on the substrate stage.

11. The apparatus according to claim 10, wherein said acquisition system calculates a radius of an image projected onto the substrate stage on the basis of a plurality of measured coordinates, and wherein said controller is further arranged to change the ratio of the currents to be respectively supplied to said first and second magnetic lenses, so that a radius obtained by measurement coincides with a theoretical radius obtained when said projection optical system has no aberration.

12. The apparatus according to claim 9, wherein said acquisition system further comprises a substrate having a mark, the substrate being placed on the substrate stage during measurement, and wherein said measurement unit detects backscatter electrons from the substrate, thereby measuring coordinates of a position where the charged particle beam that has passed through said transmitting system becomes incident on the substrate stage.

13. The apparatus according to claim 12, wherein measurement of the coordinates of the incident position is performed while moving the substrate stage such that the mark moves across the position where the charged particle beam that has passed through said transmitting system becomes incident on the substrate stage.

14. The apparatus according to claim 13, wherein the mark is a crisscross mark made of a heavy metal.

15. A method of manufacturing a device, comprising the steps of:

fixing a mask on the mask stage of the projection apparatus according to claim 1;

placing a substrate on a substrate stage of the projection apparatus; and transferring a pattern formed on the mask onto the substrate.

16. The apparatus according to claim 1, wherein said controller is further arranged to change the ratio of the currents respectively supplied to said first and second magnetic lenses under a condition that a sum of the currents respectively supplied to said first and second magnetic lenses is substantially constant.

17. A control method for a projection apparatus having a mask stage for holding a mask, a charged particle beam source which emits a charged particle beam, an irradiation system which has a shaping system for shaping the charged particle beam to have an arcuate cross-section and which irradiates the mask with the arcuate cross-sectional charged particle beam, and a projection optical system which projects a pattern formed on the mask onto a substrate, the projection optical system including a first unit having first and second magnetic lenses, said method comprising:

an acquisition step of acquiring correction information necessary for correcting aberrations of the projection optical system; and a control step of moving a principal plane of the first unit so that an image distortion of the projection optical system is corrected, wherein said control step comprises changing a distribution of an axial magnetic field generated by said first unit in a direction of an optical axis of the projection optical system on the basis of the correction information to move the principal plane of said first unit by changing a ratio of currents to be respectively supplied to said first and second magnetic lenses, so that third-order image distortion and fifth-order image distortion substantially cancel each other.

18. A projection apparatus for projecting a pattern formed on a mask onto a substrate, said projection apparatus comprising:

an irradiation system which irradiates the mask with a charged particle beam emerging from a charged particle beam source;

a projection optical system which has a magnetic lens and which projects the pattern onto the substrate; and a controller arranged to move a principal plane of said magnetic lens in a direction of an optical axis of said projection optical system so as to adjust an image distortion of said projection optical system, wherein said controller changes a distribution of an axial magnetic field generated by said magnetic lens in the direction of the optical axis of said projection optical system to move the principal plane of said magnetic lens by controlling a current to be supplied to said magnetic lens, so that third-order image distortion and fifth-order image distortion substantially cancel each other.

19. A method of manufacturing a device, said method comprising the steps of:

transferring a circuit pattern onto a substrate using the projection apparatus of claim 18; and developing the resultant substrate.

20. A projection apparatus for projecting a pattern formed on a mask onto a substrate, said projection apparatus comprising:

an irradiation system which irradiates the mask with a charged particle beam emerging from a charged particle beam source;

a projection optical system which projects the pattern onto the substrate, said projection optical system including (a) a first unit having first and second magnetic lenses and (b) a second unit having third and fourth magnetic lenses; and a controller arranged to change a distribution of an axial magnetic field generated by said first unit in a direction of an optical axis of said projection optical system to move a first principal plane of said first unit in the direction of the optical axis of said projection optical system by changing a ratio of currents to be respectively supplied to said first and second magnetic lenses, and to change a distribution of an axial magnetic field generated by said second unit in the direction of the optical axis of said projection system to move a second principal plane of said second unit in the direction of the optical axis of said projection optical system by changing a ratio of currents to be respectively supplied to said third and fourth magnetic lenses, so as not to change a magnification of said projection optical system and so that third-order image distortion and fifth-order image distortion of said projection optical system substantially cancel each other, wherein a moving amount of the second principal plane is equal to a value obtained by multiplying a moving amount of the first principal plane by a magnification of said projection optical system, and a moving direction of the first principal plane is the opposite direction to that of the second principal plane.

21. The apparatus according to claim 20, wherein said controller is further arranged to change the ratio of the currents to be respectively supplied to said first and second magnetic lenses and the ratio of currents to be respectively supplied to said third and fourth magnetic lenses under a condition that a sum of the currents respectively supplied to said first and second magnetic lenses is substantially constant and a sum of the currents respectively supplied to said third and fourth magnetic lenses is substantially constant.

22. The apparatus according to claim 20, wherein said controller is further arranged to change the ratio of the currents to be respectively supplied to said first and second magnetic lenses and the ratio of currents to be respectively supplied to said third and fourth magnetic lenses so as to adjust an image distortion of said projection optical system.

23. A method of manufacturing a device, said method comprising the steps of:

transferring a circuit pattern onto a substrate using the projection apparatus of claim 20; and developing the resultant substrate.

24. A projection apparatus for projecting a pattern formed on a mask onto a substrate, said projection apparatus comprising:

an irradiation system which irradiates the mask with a charged particle beam emerging from a charged particle beam source;

a projection optical system which has a magnetic lens and which projects the pattern onto the substrate; and a controller arranged to move a principal plane of said magnetic lens in a direction of an optical axis of said projection optical system so as to adjust an image distortion of said projection optical system, the image distortion being distortion caused by an error of a projected image position in a direction perpendicular to the optical axis of said projection optical system, wherein said controller changes a distribution of an axial magnetic field generated by said magnetic lens in the direction of the optical axis of said projection optical system to move the principal plane of said magnetic lens by controlling a current to be supplied to said magnetic lens, so that third-order image distortion and fifth-order image distortion substantially cancel each other.

25. A projection apparatus for projecting a pattern formed on a mask onto a substrate, said projection apparatus comprising:

an irradiation system which irradiates the mask with a charged particle beam emerging from a charged particle beam source;

a projection optical system which has a magnetic lens and which projects the pattern onto the substrate; and a controller arranged to adjust an image distortion of said projection optical system, said controller controlling a current supplied to said magnetic lens, changing a distribution of an axial magnetic field generated by said magnetic lens in a direction of an optical axis of said projection optical system, and moving a principal plane of said magnetic lens in the direction of the optical axis of said projection optical system, so that third-order image distortion and fifth-order image distortion substantially cancel each other.

26. A method of manufacturing a device, said method comprising the steps of:

transferring the pattern onto the substrate using the projection apparatus of claim 25; and developing the resultant substrate.

27. A projection apparatus for projecting a pattern formed on a mask onto a substrate, said projection apparatus comprising:

an irradiation system which irradiates the mask with a charged particle beam emerging from a charged particle beam source;

a projection optical system which has a magnetic lens and which projects the pattern onto the substrate; and a controller arranged to adjust an image distortion of said projection optical system, said controller changing a distribution of an axial magnetic field generated by said magnetic lens in a direction of an optical axis of said projection optical system and moving a principal plane of said magnetic lens in the direction of the optical axis of said projection optical system, so that third-order image distortion and fifth-order image distortion substantially cancel each other.

28. A method of manufacturing a device, said method comprising the steps of:

transferring the pattern onto the substrate using the projection apparatus of claim 27; and developing the resultant substrate.

* * * * *

UNITED STATES PATENT AND TRADEMARK OFFICE
CERTIFICATE OF CORRECTION

PATENT NO. : 7,034,314 B2
APPLICATION NO. : 09/330154
DATED : April 25, 2006
INVENTOR(S) : Susumu Goto

It is certified that error appears in the above-identified patent and that said Letters Patent is hereby corrected as shown below:

IN THE DRAWINGS
Sheet 6, Fig. 6, "ABEPRATION" should read --ABERRATION--.

COLUMN 3
Line 3, "pair magnetic" should read --pair of magnetic--.

Signed and Sealed this

Twenty-sixth Day of December, 2006

JON W. DUDAS
*Director of the United States Patent and Trademark Office*